United States Patent [19]

Hughes et al.

[11] Patent Number: 5,717,623
[45] Date of Patent: Feb. 10, 1998

[54] ANALOG CURRENT MEMORY HAVING RESISTANCE TO REDUCE CURRENT TRANSPORT ERROR

[75] Inventors: John B. Hughes, Hove; Kenneth W. Moulding, Horley, both of England

[73] Assignee: U.S. Philips Corporation, New York, N.Y.

[21] Appl. No.: 708,156

[22] Filed: Aug. 27, 1996

[30] Foreign Application Priority Data

Aug. 31, 1995 [GB] United Kingdom ............ 9517791

[51] Int. Cl.⁶ .................................... G11C 27/00
[52] U.S. Cl. .................................. 365/45; 365/233
[58] Field of Search ............................ 365/45, 233

[56] References Cited

U.S. PATENT DOCUMENTS 4,054,864  10/1977  Audaire et al. .............. 340/173 R
5,400,273   3/1995  Hughes et al. ................... 365/45

FOREIGN PATENT DOCUMENTS

0268345B1  6/1992  European Pat. Off. .
0608936A1  8/1994  European Pat. Off. .
406053515 A  2/1994  Japan ............................ 365/45

Primary Examiner—David C. Nelms
Assistant Examiner—Hien Nguyen
Attorney, Agent, or Firm—Leroy Eason

[57] ABSTRACT

A current memory has an input (1) which is connected via a switch (S1) to inputs of a coarse memory cell (CM) and a fine memory cell (FM). On a phase $\phi 1$ of a clock signal the switch (S1) closes. During a first part $\phi 1a$ of the clock $\phi 1$ of the coarse memory cell samples the input current and the outputs the sampled current thereafter. During a second part $\phi 1b$ of the clock $\phi 1$ the fine memory cells senses and stores the difference between the input current and the output current of the coarse memory (CM). An output switch (S5) closes on phase $\phi 2$ of the clock, thereby passing the combined outputs of the coarse and fine memories to an output (2). A resistor $r_s$ is provided between the common nodes of the coarse and fine memories, having a resistance equal to the "on" resistance of the output switch (S5). This substantially compensates for the voltage drop caused by the internal resistance of the output switch in the closed state, thereby reducing current transport error between the coarse and fine memories.

3 Claims, 3 Drawing Sheets 5,717,623

1

ANALOG CURRENT MEMORY HAVING RESISTANCE TO REDUCE CURRENT TRANSPORT ERROR

BACKGROUND OF THE INVENTION

1. Field of the Invention

The invention relates to an analogue current memory comprising a first, coarse; current memory cell, a second, fine, current memory cell, an input for receiving a current to be stored, an output for delivering the stored current, first switch means for applying the input current to the first current memory cell during a first part of a first portion of a clock cycle, second switch means for applying the input current to the second current memory cell during a second part of the first portion of the clock cycle, and third switch means for delivering the combined output currents of the first and second current memory cells to the output of the current memory during a later portion of the clock cycle or during a subsequent clock cycle.

2. Description of the Related Art

Such an analogue current memory is disclosed in EP-A-0608 936 (Docket PHB 33830), which corresponds to U.S. Pat. No. 5,400,273, issued Mar. 21, 1995, assigned to the present assignee. While that current memory, which is known as $S^2I$ current memory, gives a better performance than the simple current memory earlier proposed for switched current circuits and shown in FIG. 3.4 at page 36 of the book edited by C. Toumazou, J. B. Hughes, and N. C. Battersby entitled "SWITCHED-CURRENTS an analogue technique for digital technology" and published by Peter Peregrinus Limited in 1993, it still does not give an ideal performance.

SUMMARY OF THE INVENTION

It is an object of the invention to provide an analogue current memory as set forth in the opening paragraph and which produces a more accurate replica of the input current at its output.

Such an analogue current memory is characterised in that resistance means having a resistance substantially equal to the "on" resistance of the third switch means is coupled between the junction of the first and second switch means and the junction of the outputs of the first and second current memory cells.

The invention is based on the realisation that one of the sources of error in the current memory disclosed in EP-A-0608936 is the "on" resistance of the output switch means, since when the output current passes through it a potential difference will be developed across it due to the finite on resistance of the switch. Thus, the nominally equal voltages at the output of a first current memory and the input of a second current memory connected in cascade will differ by the voltage drop across the output switch. This error voltage gives rise to a current transport error due to the finite drain resistances and drain-gate capacitances of the field effect transistors making up the coarse and fine current memory cells. By adding resistance means as described this error voltage can be compensated to substantially reduce the current transport error.

When the third switch means comprises a field effect transistor whose gate electrode receives a switching signal derived from the clock signal, the added resistance means may comprise a further field effect transistor having substantially the same dimensions and being switched on by the same potential as the first mentioned transistor.

2

This provides a resistance value very close to and which accurately tracks that of the "on" resistance of the third switch means. The invention further provides a delay line for analogue currents comprising a plurality of such current memories connected in cascade or parallel.

BRIEF DESCRIPTION OF THE DRAWINGS

The above and other features and advantages of the invention will become apparent from the following description, by way of example, of embodiments of the invention with reference to the accompanying drawings, in which.

DESCRIPTION OF THE PREFERRED EMBODIMENTS

Figure 1:
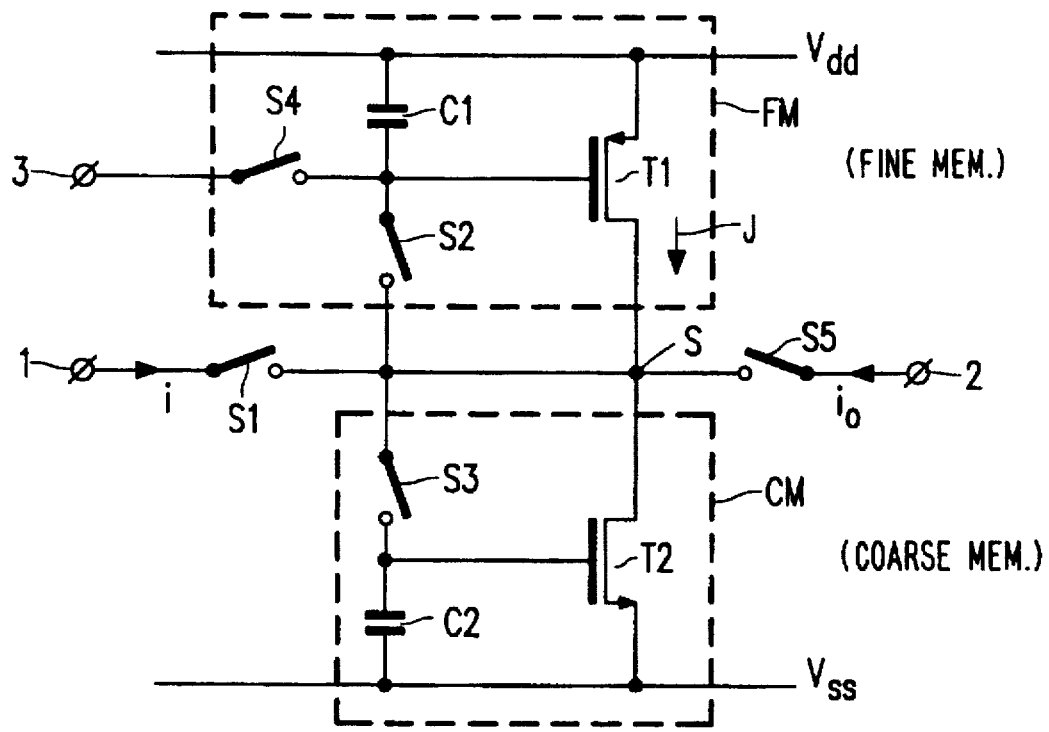
FIG. 1 is a circuit diagram of a current memory as disclosed in EP-A-0 608 936.

As shown in FIG. 1 the current memory therein has an input 1 which is connected via a switch S1 to the junction of the drain electrodes of a p-channel field effect transistor T1 and an n-channel field effect transistor T2. The source electrode of transistor T1 is connected to a supply rail $V_{dd}$ while the source electrode of transistor T2 is connected to a supply rail $V_{ss}$. The switch S1 is connected to a further switch S2 the other end of which is connected to the gate electrode of transistor T1. The switch S1 is also connected to a further switch S3 whose other side is connected to the gate electrode of transistor T2. An input terminal 3 to which a reference voltage $V_e$ is applied, is connected via a switch S4 to the gate electrode of transistor T1. The junction of the drain electrode of transistors T1 and T2 is connected to an output 2 via a switch S5. A capacitor C1 is connected between the source and gate electrodes of transistor T1, this capacitor C1 may be formed by the gate source channel capacitance of transistor T1. Similarly a capacitor C2 is connected between the gate and source electrodes of transistor T2. The capacitor C2 may be formed by the gate source channel capacitance of transistor T2. Transistor T2, capacitor C2, and switch S3 form a coarse memory CM, while transistor T1, capacitor C1, switch S2, and switch S4 form a fine memory FM.

Figure 5:
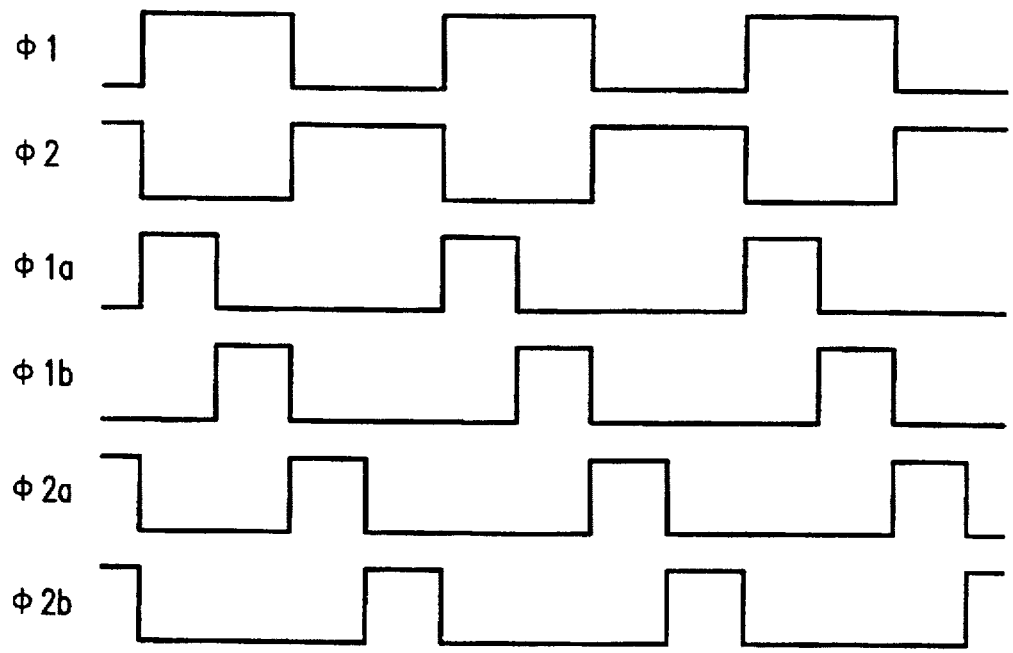
FIG. 5 shows clock waveforms for operating the switch means of the current memories.

The operation of the current memory shown in FIG. 1 will be described with the aid of the clock waveforms shown in FIG. 5. In this embodiment the memory is arranged to sample the input current during phase $\phi 1$ of the clock signal and to produce the stored current during phase $\phi 2$ of the clock signal. Clearly the current memory cell could sample the input current during phase $\phi 2$ of a clock signal and output the stored current during phase $\phi 1$ of a later clock signal cycle. It is not essential that the clock timings are as shown, it could be that the input signal is sampled during one clock sample and the output is produced during a later clock cycle not necessarily the next clock cycle. In order to operate the current memory as shown in FIG. 1 the clock cycle is split into two phases $\phi 1$ and $\phi 2$. The first phase $\phi 1$ is further subdivided into two sub-phases φ1a and φ1b. Phases φ1 and φ2 are non overlapping while sub-phases φ1a and φ1b are overlapping. There are also phases φ2a and φ2b so that a cascade of current memories can be implemented, two current memories in cascade forming a one clock period delay. In this case the input current to the second current memory is sampled during phase φ2 and under these circumstances phases φ2a and φ2b are required.

During phase φ1 switch S1 is closed and the input current applied to input 1 is sampled. During the sub-phase φ1a switches S3 and S4 are closed while switches S2 and S5 are open. Under these circumstances the transistor T1 forms a bias current source which produces a bias current J which is dependent on the dimensions of the transistor T1 and the bias voltage $V_e$. As switch S3 is closed transistor T2 is configured as a diode and the input current i plus the bias current J produced by transistor T1 is conducted by the transistor T2 and the capacitance C2 is charged via the switch S3. At the end of the phase φ1a the switch S3 opens but the transistor T2 continues to conduct the current J+i because of the charge on the capacitance C2 holding the gate voltage of the transistor T2 at such a level that the current J+i is conducted. In practice the current conducted is not precisely J+i since the transistor is non-ideal in a number of respects which causes the current stored in the current memory cell CM to differ from that sampled during sub-phase φ1a. Thus the current actually produced by transistor T2 will be J+i+Δi; where Δi is an error current. At the end of sub-phase φ1a the switch S4 also opens but the charge on capacitor C1 will cause the transistor T1 to continue to supply the current J. On phase φ1b switch S2 closes and so transistor T1 becomes configured as a diode and will conduct the current J+Δi. At the end of phase φ1b the charge on capacitor C1 maintains the current through transistor T1 at J+Δi when the switch S2 closes. Thus on phase φ2 when switch S5 opens the total current produced at the junction of the transistors T1 and T2 become substantially equal to i and this current i will be fed to the output 2.

At the end of the input phase φ1b the transistor T1 has a nearly fixed drain current which is substantially independent of the signal current i. This is because it only produces the small error current which remains after the transistor T2 in the coarse memory cell has sampled the input current. Thus the signal related portion of the current produced by transistor T1 is Δi, which is merely the error from the coarse memory cell CM. The bias current J will be substantially in excess of this error current. Consequently the voltage at the internal node S, that is the junction of the drain electrodes of transistors T1 and T2, is substantially independent of the signal and is approximately equal to the bias voltage $V_e$. A cascade of such memories each has its internal node S at a voltage close to $V_e$ at the end of both its input phase, due to its own internal P memory, and its output phase, due to the P memory of the following cell. This feature enables the memory to reduce substantially the error which results from finite drain resistance and drain gate capacitance in both the transistors T1 and T2.

Figure 2:
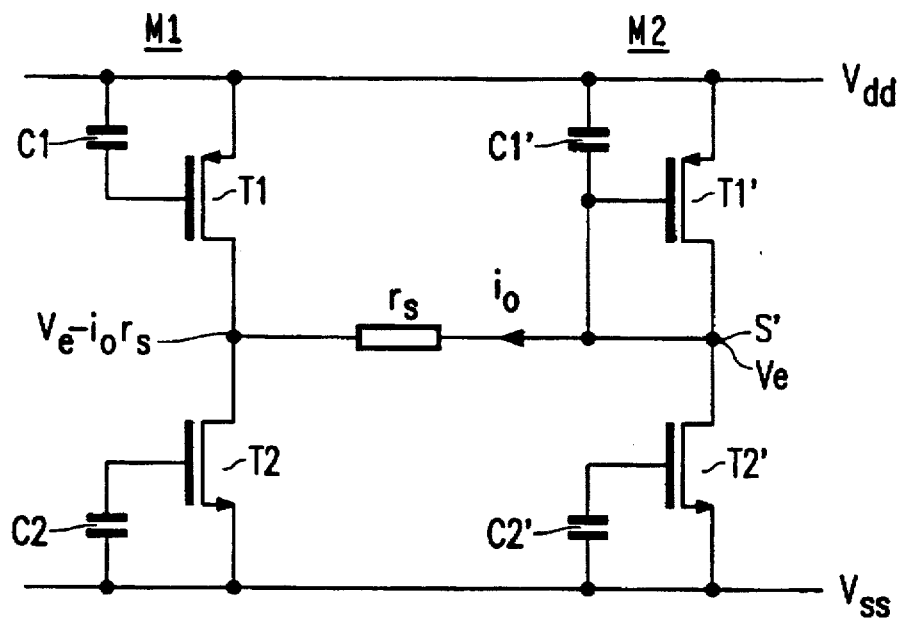
FIG. 2 illustrates the source of errors when two current memories as shown in FIG. 1 are connected in cascade.

However, the "on" resistance of the input and output switches S1 and S5 gives rise to additional errors as is illustrated in FIG. 2. FIG. 2 illustrates the case where the memory M1 is driving a second memory M2 and illustrates the situation close to the end of the period φ2b. Under these circumstances the switch S5 of memory M1 is closed and also forms the switch S1 of memory M2. The switch has an on resistance of $r_s$. At the end of the φ2b phase the node S of memory M2 is close to the voltage $V_e$. The switch "on" resistance $r_s$ develops a voltage drop $i_o r_s$ so that the voltage at the internal node S of memory M1 becomes $V_e - i_o r_s$. This error voltage $i_o r_s$ gives a current transport error due to the finite drain resistances and drain gate capacitances of transistors T1 and T2. This can be reduced by using wide switch transistors to lower $r_s$ but this gives increased capacitances and consequently increased current glitches.

Figure 3:
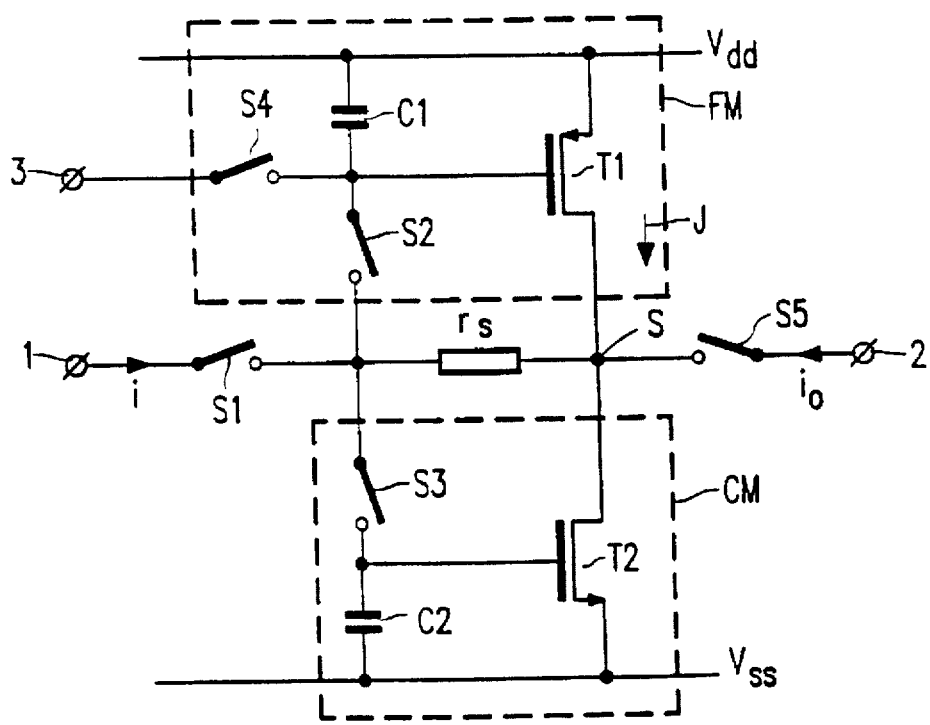
FIG. 3 is a circuit diagram of an embodiment of a current memory according to the invention.

FIG. 3 is an embodiment of a current memory according to the invention. Elements in FIG. 3 corresponding to those in FIG. 1 have been given the same reference signs. The essential difference between the current memory cell illustrated in FIG. 3 and the prior art cell shown in FIG. 1 is that in FIG. 3 a resistor having a value $r_s$ is connected between the node S and the junction of switches S1, S2 and S3. The resistance of resistor $r_s$ is made equal to that of the "on" resistance of the input and output switches S1 and S5. This can be easily achieved by making it from a transistor with the same dimensions as those of the switches and held on by the same gate voltage as is applied to the switches.

Figures 4A, 4B:
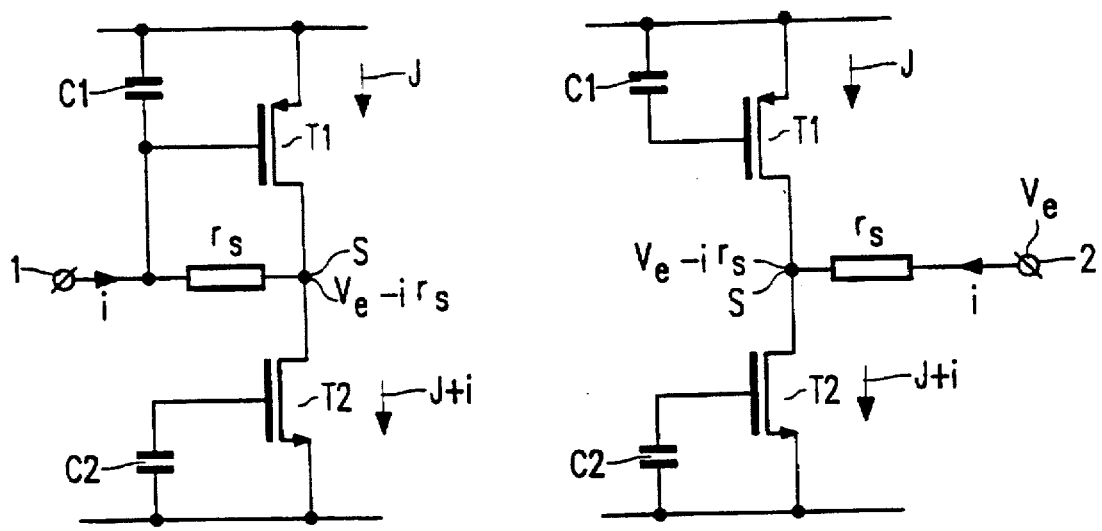
FIG. 4 shows the operation of the current memory of FIG. 3 on a) input and b) output phases.

FIG. 4 illustrates the internal voltages at the end of the input and output phases. In FIG. 4a it can be seen that at the end of phase φ1 the voltage $V_e$ which is present at the gate electrode of transistor T1 is decreased by the value $r_s$ x i so that the voltage at node S is $V_e - i r_s$. Similarly at the end of phase φ2 the voltage $V_e$ from the succeeding stage is dropped by the value i x $r_s$ through the closed switch resistance of switch S5 to also produce the voltage $V_e - i r_s$ at the node S. Consequently at each stage the internal node voltage is held at a value $V_e - i r_s$ and consequently no current transport error results from the effect of the resistance $r_s$ of the switch S5 when "on".

As a result of this modification to the current memory the memory may be designed with small input and output switches, that is switches having a higher "on" resistances $r_s$, to reduce the current glitches since smaller switches will have correspondingly smaller parasitic capacitances. This will give greater precision and linearity in both data converters (e.g. as delay cells in pipelined converters) and filters (in sample and hold circuits and delay lines).

Figure 6:
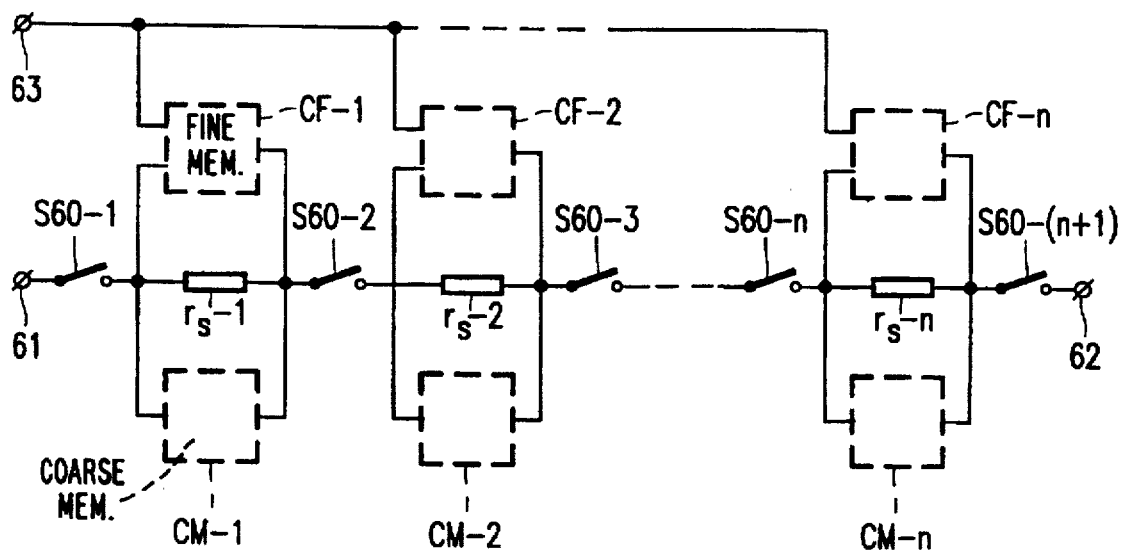
FIG. 6 shows the schematic form an analogue current delay line according to the invention.

FIG. 6 illustrates how a plurality of current memories as shown in FIG. 3 may be used to form a delay line. The delay line has an input 61 which is connected via a switch S60-1 to the input of a first current memory which comprises a coarse memory cell CM-1 and a fine memory cell CF-1. The combined outputs of the memory cells CM-1 and CF-1 is fed via a switch S60-2 to a second current memory which comprises a coarse memory cell CM-2 and a fine memory cell CF-2. This structure is repeated until the final current memory, which comprises a coarse memory cell CM-n and a fine memory cell CF-n, is reached. The output of the current memory is fed via a switch S60-(n+1) to the output 62 of the delay line. The odd numbered switches 60 are closed when φ2 is high. The coarse memories CM and fine memories CF are of the form described with reference to FIG. 3 while an input 63 has the reference voltage $V_e$ applied to it. Each current memory is provided with a resistor $r_s$-1 to $r_s$-n whose value is chosen to compensate for the "on" resistance of its output switch.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention.

We claim:

1. An analogue current memory having an input for receiving a current to be stored and further comprising:
   a coarse current memory cell and a fine current memory cell;
   first switch means (S1, S3) for applying the input current to the coarse current memory cell during a first part of a first portion of a clock signal cycle;
   second switch means (S1, S2) for applying the input current to the fine current memory cell during a second part of the first portion of the clock signal cycle;
   third switch means (S5) for delivering the combined output currents of the coarse and fine current memory cells to an output of the analog current memory during a second portion of the clock signal cycle or during a subsequent cycle thereof, said third switch means having an on-state resistance; and
   resistance means coupled between a common junction of the first and second switch means and a common junction of the outputs of the coarse and fine current memory cells, said resistance means having a resistance substantially equal to the on-state resistance of the third switch means.

2. An analogue current memory as claimed in claim 1, wherein: the third switch means (S5) comprises a field effect transistor whose gate electrode receives a switching signal derived from the clock signal, and the resistance means comprises a further field effect transistor having substantially the same dimensions and substantially the same gate turn-on potential as the first mentioned field effect transistor.

3. A delay line comprising a plurality of analogue current memories as claimed in claim 1 connected in cascade, the output of each memory being coupled to the input of the succeeding memory.

* * * * *